United States Patent
Aoki et al.

(10) Patent No.: US 10,402,150 B2
(45) Date of Patent: Sep. 3, 2019

(54) AUDIO-SIGNAL PROCESSING DEVICE, AND AUDIO-SIGNAL PROCESSING METHOD

(71) Applicant: Yamaha Corporation, Hamamatsu-shi, Shizuoka (JP)

(72) Inventors: Ryotaro Aoki, Hamamatsu (JP); Tomoko Ninomiya, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 15/126,772

(22) PCT Filed: Mar. 17, 2015

(86) PCT No.: PCT/JP2015/057959
§ 371 (c)(1),
(2) Date: Sep. 16, 2016

(87) PCT Pub. No.: WO2015/141697
PCT Pub. Date: Sep. 24, 2015

(65) Prior Publication Data
US 2017/0097805 A1    Apr. 6, 2017

(30) Foreign Application Priority Data
Mar. 19, 2014   (JP) ................................ 2014-056941

(51) Int. Cl.
*G06F 3/16* (2006.01)
*H04S 7/00* (2006.01)
(Continued)

(52) U.S. Cl.
CPC ............. *G06F 3/165* (2013.01); *H03G 5/005* (2013.01); *H03G 5/165* (2013.01); *H03G 9/005* (2013.01);
(Continued)

(58) Field of Classification Search
CPC . H04R 3/00; H04R 3/005; H04R 3/12; H04R 5/02; H04R 2400/01;
(Continued)

(56) References Cited

U.S. PATENT DOCUMENTS 5,172,358 A * 12/1992 Kimura .................. H03G 5/005
369/47.26
2006/0161283 A1* 7/2006 Chung .................... H04S 7/307
700/94

(Continued)

FOREIGN PATENT DOCUMENTS

JP            5-41626 A      2/1993
JP     H05-041626 A  *  2/1993
(Continued)

OTHER PUBLICATIONS

International Search Report (PCT/ISA/210) issued in PCT Application No. PCT/JP2015/057959 dated Apr. 21, 2015 with English translation (five pages).

(Continued)

*Primary Examiner* — Yogeshkumar Patel
(74) *Attorney, Agent, or Firm* — Crowell & Moring LLP

(57) ABSTRACT

An audio signal processing device includes an audio signal processing unit which performs signal processing on an audio signal, a sound volume setting receiving unit which receives a sound volume set value, and a sound volume measuring unit which measures a sound volume at a listening position. The audio signal processing unit performs a loudness correction which increases a level of the audio signal in a prescribed frequency range as the sound volume set value decreases. The sound volume measuring unit measures sound volumes corresponding to plural respective sound volume set values at the listening position. The audio signal processing unit sets a level adjustment amount to be used in performing the loudness correction based on the (Continued)

sound volume set value received by the sound volume setting receiving unit and the measurement sound volumes of the sound volume measuring unit.

12 Claims, 7 Drawing Sheets

(51) Int. Cl.
- *H03G 5/00* (2006.01)
- *H03G 5/16* (2006.01)
- *H03G 9/00* (2006.01)
- *H03G 9/02* (2006.01)
- *H04R 29/00* (2006.01)

(52) U.S. Cl.
CPC ........... *H03G 9/025* (2013.01); *H04R 29/001* (2013.01); *H04S 7/301* (2013.01); *H04R 2430/01* (2013.01); *H04R 2430/03* (2013.01)

(58) Field of Classification Search
CPC ............ H04R 2430/01; H04R 2430/03; H04R 25/356; H04R 25/50; H04R 25/505; H04R 29/00; H04R 29/001; H04R 25/502; H04R 2330/01; G06F 3/165; G06F 3/167; H04S 7/301; H04S 7/303; H04S 7/30; H04S 7/307; H04S 7/304; H04S 2420/03; H04S 2400/01; H03G 9/005; H03G 9/025; H03G 5/165
USPC ..... 381/107, 104, 106, 56, 98, 108, 58, 303, 381/307, 57, 103, 1; 700/94
See application file for complete search history.

(56) References Cited

U.S. PATENT DOCUMENTS

| | | | |
|---|---|---|---|
| 2012/0288124 A1 | 11/2012 | Fejzo et al. | |
| 2014/0037108 A1* | 2/2014 | Christoph | H03G 3/20 381/107 |

FOREIGN PATENT DOCUMENTS

| | | | | |
|---|---|---|---|---|
| JP | H05-041626 A | * | 2/1993 |
| JP | 6-133390 A | | 5/1994 |
| JP | H06-133390 A | * | 5/1994 |
| JP | H06-133390 A | * | 5/1994 |
| JP | 2007-306444 A | * | 11/2007 |
| JP | 2007-306444 A | * | 11/2007 |
| JP | 2009-200761 A | * | 9/2009 |
| JP | 2009-200761 A | * | 9/2009 |
| JP | 2013-143763 A | | 7/2013 |

OTHER PUBLICATIONS

Japanese-language Written Opinion (PCT/ISA/237) issued in PCT Application No. PCT/JP2015/057959 dated Apr. 21, 2015 (four pages).
Extended European Search Report issued in counterpart European Application No. 15764345.3 dated Oct. 10, 2017 (Nine (9) pages).
Japanese-language Office Action issued in counterpart Japanese Application No. 2014-056941 dated Apr. 3, 2018 with English translation (five (5) pages).

* cited by examiner

FIG. 3

| MASTER VOLUME | 100Hz | 10kHz |
|---|---|---|
| 0 dB (80 PHONS) OR LARGER | 0dB | 0dB |
| −1dB | +0.25dB | 0dB |
| −2dB | +0.5dB | 0dB |
| ⋮ | ⋮ | ⋮ |
| −10dB | +2.5dB | 0dB |
| −11dB | +2.75dB | 0dB |
| ⋮ | ⋮ | ⋮ |
| −20dB | +5dB | 0dB |
| −21dB | +5.25dB | 0dB |
| ⋮ | ⋮ | ⋮ |
| −25dB | +6.25dB | 0dB |
| ⋮ | ⋮ | ⋮ |
| −40dB | +10dB | +2dB |
| −41dB | +10.5dB | +2.15dB |
| ⋮ | ⋮ | ⋮ |
| −50dB | +15dB | +3.5dB |
| ⋮ | ⋮ | ⋮ |
| −60 dB OR SMALLER | +20dB | +5dB |

FIG. 5

| MASTER VOLUME | MEASURE-MENT RESULT | OFFSET VALUE | SOUND VOLUME MEASURED AT LISTENING POSITION | 100Hz | 10kHz |
|---|---|---|---|---|---|
| 0 dB (80 PHONS) | 75phon | −5dB | −5dB | 1.25dB | 0dB |
| ⋮ | ⋮ | ⋮ | ⋮ | ⋮ | ⋮ |
| −20dB | 55phon | −5dB | −25dB | 6.25dB | 0dB |
| −21dB | 53.9phon | −5.1dB | −26.1dB | 6.525dB | 0dB |
| −22dB | 52.8phon | −5.2dB | −27.2dB | 6.8dB | 0dB |
| ⋮ | ⋮ | ⋮ | ⋮ | ⋮ | ⋮ |
| −39dB | 31.1phon | −9.9dB | −48.9dB | 14.45dB | 0dB |
| −40dB | 30phon | −10dB | −50dB | 15dB | 3.5dB |
| −41dB | 28.5phon | −10.2dB | −51.2dB | 15.6dB | 3.68dB |
| ⋮ | ⋮ | ⋮ | ⋮ | ⋮ | ⋮ |
| −60dB | 6phon | −14dB | −74dB | 20dB | 5dB |

(A)

(B)

US 10,402,150 B2

AUDIO-SIGNAL PROCESSING DEVICE, AND AUDIO-SIGNAL PROCESSING METHOD

TECHNICAL FIELD

The present invention relates to an audio signal processing device and an audio signal processing method for performing various kinds of processing on an audio signal and, more particularly, to a technique for correcting frequency characteristics.

BACKGROUND ART

The sensitivity of human auditory sense depends on the frequency. For example, low-frequency components and high-frequency components are less audible when the sound volume is small. Characteristics of this kind are described as an equal loudness curve in ISO226: 2003.

In view of this, in conventional audio signal processing devices, the frequency characteristics are corrected according to the equal loudness curve by performing processing of increasing the levels of low-frequency components and high-frequency components as the sound volume setting value of a master volume decreases (refer to Patent document 1, for example).

PRIOR ART DOCUMENTS

Patent Documents

Patent document 1: JP-A-2013-143763

SUMMARY OF THE INVENTION

Problems to be Solved by the Invention

However, in conventional audio signal processing devices, a correction is not made taking into consideration a sound volume at an actual listening position.

For example, the sound volume at a listening position is large when the distances between the listening position and speakers are short, and is small when the distances between the listening position and the speakers are long. Furthermore, the sound volume at a listening position varies depending on the listening environment. For example, the sound volume at a listening position is reduced in the case where a thing having a small sound absorption coefficient such as curtains is installed near speakers. Still further, there are speakers whose output level does not vary linearly with respect to the input level. For example, there are speakers that produce an unexpectedly small sound volume (i.e., the efficiency is low) when the input level is low.

In view of the above, an object of the invention is therefore to provide an audio signal processing device and an audio signal processing method that make it possible to perform a loudness correction taking a sound volume at an actual listening position into consideration.

Means for Solving the Problems

The audio signal processing device according to the invention includes an audio signal processing unit configured to perform signal processing on an audio signal, a sound volume setting receiving unit configured to receive a sound volume set value, and a sound volume measuring unit configured to measure a sound volume at a listening position. The audio signal processing unit performs a loudness correction which increases the level of the audio signal in a prescribed frequency range as the sound volume set value decreases.

The sound volume measuring unit measures sound volumes corresponding to plural respective sound volume set values at the listening position, and the audio signal processing unit sets a level adjustment amount to be used in performing the loudness correction on the basis of the sound volume set value of the sound volume setting receiving unit and the measurement sound volumes of the sound volume measuring unit.

As described above, in the audio signal processing device according to the invention, sound volumes at the actual listening position are measured that correspond to a sound volume set value received by the sound volume setting receiving unit (master volume). The audio signal processing unit performs a loudness correction on the basis of the sound volume set value of the master volume and the measurement sound volumes. For example, using 80 phons (the sound volume set value of the master volume is 0 dB) as a reference, the loudness correction is supposed to increase the level at 100 Hz by 5 dB, 10 dB, and 20 dB when the master volume is set at −20 dB (60 phons), −40 dB (40 phons), and −60 dB (20 phons), respectively. If a sound volume measured at the actual listening position when the sound volume set value of the master volume is −20 dB is 40 phons (−40 dB), the audio signal processing unit used in the invention performs the correction that should be performed when the master volume is set at −40 dB. That is, the audio signal processing unit increases the level at 100 Hz by 10 dB. If a sound volume measured at the actual listening position when the sound volume set value of the master volume is −40 dB is 20 phons (−60 dB), the audio signal processing unit performs the correction that should be performed when the master volume is set at −60 dB, that is, increases the level at 100 Hz by 20 dB.

As described above, in the audio signal processing device according to the invention, a loudness correction is performed by measuring sound volumes at the actual listening position. Thus, the audio signal processing device can perform a proper loudness correction irrespective of the distances between the listening position and the speaker. Furthermore, the audio signal processing device according to the invention can perform a proper loudness correction for a speaker whose output level does not vary linearly with respect to the input level. For example, consider a speaker that produces sound volumes −40 dB and −80 dB at the actual listening position when the sound volume set value of the master volume is −20 dB and −40 dB, respectively. For this speaker, loudness corrections corresponding to master volume set values −40 dB and −80 dB are performed when the sound volume set value of the master volume is −20 dB and −40 dB, respectively. Thus, proper loudness corrections can be performed.

For example, the audio signal processing unit performs the loudness control on each of audio signals of plural channels. In this case, the sound volume measuring unit measures sound volumes of an audio signal of a reference channel(s) (e.g., L channel and R channel) at the listening position. For audio signals of channels other than the reference channel, the audio signal processing unit performs the loudness correction on the basis of efficiency differences between a speaker for output of the audio signal of the reference channel and respective speakers for output of the audio signals of the channels other than the reference channel. For example, if the sound volumes of the L and R channels at the actual listening position are −40 dB when the sound volume set value of the master volume is −20 dB and the efficiency differences between the L and R channels and SL and SR channels are 20 dB when the sound volume is equal to −40 dB, for the SL and SR channels a loudness correction corresponding to −60 dB is performed which is even smaller by 20 dB, that is, the level at 100 Hz is increased by 10 dB. It is noted that the output sound volume (sound pressure) of a speaker for an input signal having a prescribed power (W) increases as its efficiency increases.

For example, the sound volume measuring unit measures sound volumes of the audio signals of the plural channels at the listening position, respectively, and the loudness correction is performed on the audio signal of every channel using the sound volumes measured at the listening position.

The loudness correction may be performed taking a level of the input signal into consideration. That is, since sound volumes are measured using a reference audio signal, the loudness correction is performed taking into consideration a level difference between the reference audio signal and the input signal. For example, even in the case where the sound volume set value of the master volume is −40 dB and the sound volume measured at the actual listening position is −50 dB (the reference signal is of a full scale (maximum amplitude)), a loudness correction corresponding to −60 dB is performed, that is, the level at 100 Hz is increased by 10 dB, if the level of the input signal is −10 dB. With this measure, for example, even in the case of a musical piece such as a classical one in which the signal level varies to a large extent in a single piece, a phenomenon can be prevented that high-frequency components and low-frequency components are less audible.

It is preferable that a level of the input signal to be detected after the input signal is subjected to lowpass filter processing. For example, in the case of an input signal having a frequency profile in which the levels of high-frequency components are high and those of low-frequency components are low, the level of the input signal is detected to be high because of high-level high-frequency components. Human auditory sense is such that low-frequency components are less audible particularly when the sound volume is small but high-frequency components are less sensitive to the sound volume than low-frequency components. Thus, if a loudness correction is weakened because of high-level high-frequency components, low-frequency components may be made less audible. In view of this, it is preferable that the loudness correction be performed taking the levels of low-frequency components into consideration by detecting a level of the input signal that has been subjected to lowpass filter processing.

It is preferable that the audio signal processing unit continues to measure sound volumes at the listening position and perform the loudness correction using current measurement results. This makes it possible to accommodate a case that the sound volume at the listening position is varied by a level variation of the input signal and to thereby perform a more proper loudness correction.

Where the sound volume measurement at the listening position is continued, it is preferable that dynamic range compression be performed using current measurement results and the loudness correction on the input signal that has been subjected to the dynamic range compression. With this measure, the input signal is made more audible by the dynamic range control when the sound volume is small. Furthermore, a loudness correction suitable for the level of the input signal is enabled.

The audio signal processing method includes an audio signal processing step of performing signal processing on an audio signal; a sound volume setting receiving step of receiving a sound volume set value; and a sound volume measuring step of measuring a sound volume at a listening position. In the audio signal processing step, a loudness correction which increases the level of the audio signal in a prescribed frequency range as the sound volume set value decreases is performed. In the sound volume measuring step, sound volumes corresponding to plural respective sound volume set values at the listening position is measured. In the audio signal processing step, a level adjustment amount to be used in performing the loudness correction is set on the basis of the sound volume set value received in the sound volume setting receiving step and the measurement sound volumes measured in the sound volume measuring step.

In this specification, correction amounts (see FIG. 3) that are used for a conventional loudness correction are referred to as "level increase amounts" and loudness correction amounts that are determined through an adjustment on the basis of sound volume measurement results obtained at an actual listening position (an important feature of the invention) are referred to as "level adjustment amounts."

Advantages of the Invention

The invention makes it possible to perform a loudness correction taking a sound volume at an actual listening position into consideration.

BRIEF DESCRIPTION OF THE DRAWINGS

FIG. 3 shows a relationship between the sound volume set value of a master volume and a loudness correction.

FIG. 5 shows a table of offset values.

MODES FOR CARRYING OUT THE INVENTION

Figure 1:
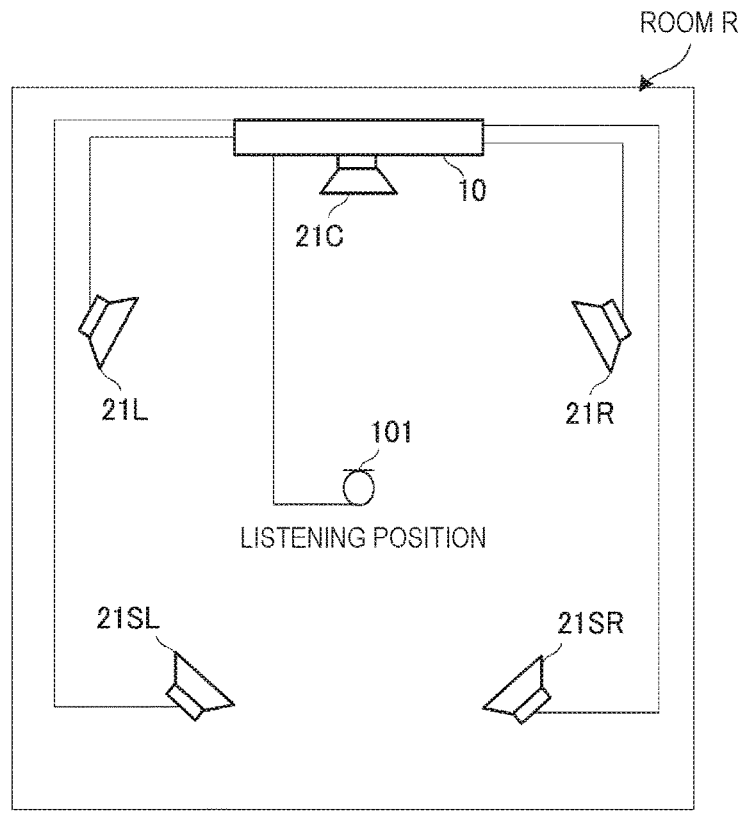
FIG. 1 is a block diagram showing the configuration of an audio system.
Figure 2:
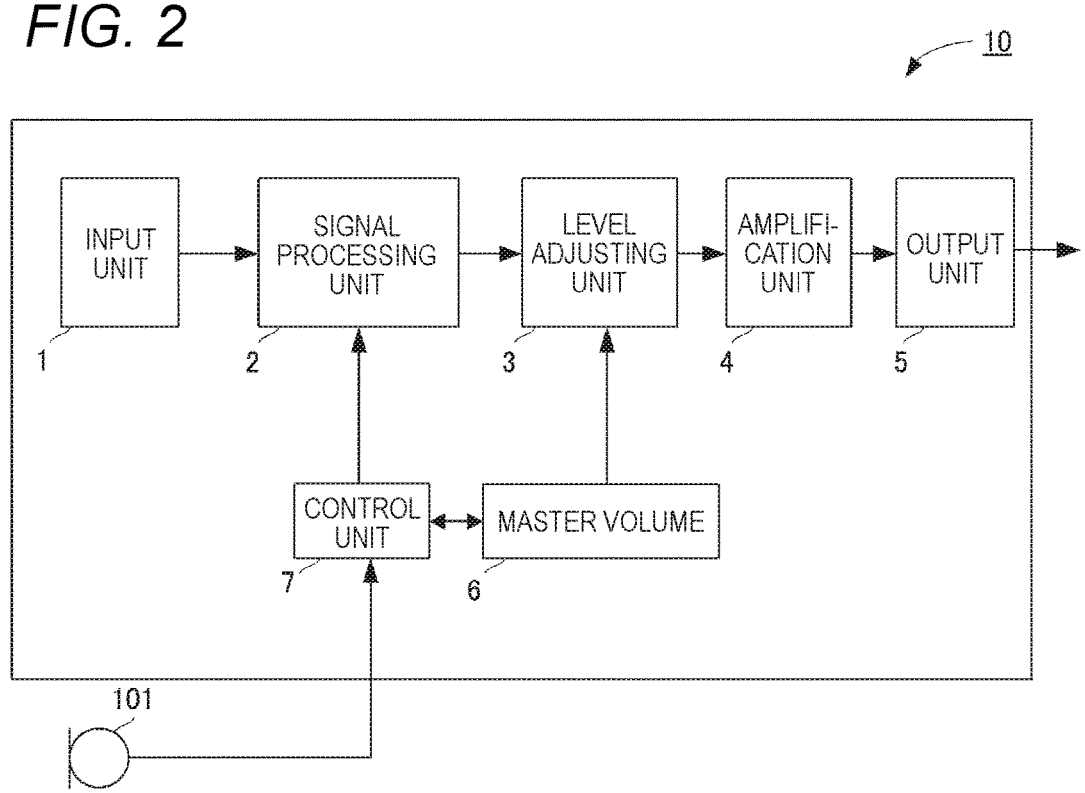
FIG. 2 is a block diagram showing the configuration of a signal processing device.

FIG. 1 is a schematic diagram showing the configuration of an audio system that is equipped with an audio signal processing device 10 according to the present invention. FIG. 2 is a block diagram showing the configuration of the audio signal processing device 10.

The audio signal processing device 10 is installed at a prescribed position (e.g., in front of a listening position 5) in a room R. Plural speakers are installed around the listening position S. In this example, a C-channel speaker 21C is disposed in front of the listening position S, an L-channel speaker 21L is disposed on the front-left of the listening position 5, an R-channel speaker 21R is disposed on the front-right of the listening position S, an SL-channel speaker 21SL is disposed on the rear-left of the listening position S, and an SR-channel speaker 21SR is disposed on the rear-right of the listening position S. These speakers are connected to the audio signal processing device 10.

A microphone 101 is installed at the listening position S. The microphone 101 is connected to the audio signal processing device 10.

As shown in FIG. 2, the audio signal processing device 10 is equipped with an input unit 1, a signal processing unit 2, a level adjusting unit 3, an amplification unit 4, an output unit 5, a master volume 6, and a control unit 7.

Having an interface, of HDMI (registered trademark), S/PDIF (registered trademark), or the like, for receiving a digital audio signal, the input unit 1 receives a digital audio signal from the outside. The input unit 1 may also have an input interface for an analog audio signal and incorporate an ADC (analog-digital converter) for converting an analog audio signal into a digital audio signal when receiving the former.

Although a 5-channel digital audio signal is input in this example, to simplify the description, FIG. 2 shows only a representative, 1-channel signal processing system. However, as for the number of channels of a digital audio signal to be input to the input unit 1, other modes are possible in which a monaural digital audio signal, a stereo digital audio signal, or a digital audio signal of an even larger number of channels (e.g., 7.1 channels) is input.

The digital audio signal received by the input unit 1 is then input to the signal processing unit 2, which corresponds to an audio signal processing unit of the invention. Being a DSP (digital signal processor, the signal processing unit 2 performs various kinds of signal processing on the digital audio signal received from the input unit 1. Although the signal processing unit 2 receives a signal of plural channels (in this example, five channels) and performs signal processing for each channel, to simplify the description, FIG. 2 shows only a representative, 1-channel signal processing system.

The digital audio signal as subjected to the signal processing in the signal processing unit 2 are converted by a DA converter (not shown) into an analog audio signal, which is level-adjusted by the level adjusting unit 3 and then input to the amplification unit 4. The level adjusting unit 3 performs a level adjustment according to a sound volume set value of the master volume 6. The amplification unit 4 amplifies the analog audio signal. The analog audio signal as amplified by the amplification unit 4 is output to the external speakers (speakers 21C, 21L, 21R, 21SL, and 21SR) via the output unit 5.

The control unit 7 reads out firmware programs from a ROM (not shown) and controls the audio signal processing device 10 in a unified manner. In the embodiment, the control unit 7 causes the signal processing unit 2 to perform loudness correction processing of increasing the levels at prescribed frequencies (e.g., 100 Hz and 10 kHz) according to a sound volume set value of the master volume 6. The signal processing unit 2 thus performs a correction in which the level increase amounts are increased as the sound volume set value of the master volume 6 decreases. This kind of control is performed to realize frequency characteristics that conform to the equal loudness curve prescribed in ISO226: 2003, for example.

FIG. 3 shows a relationship between the sound volume set value of the master volume 6 and the level increase amounts of the signal processing unit 2. FIG. 3 shows an example in which the sound volume at the listening position becomes 80 phons when the sound volume set value of the master volume 6 is 0 dB. The signal processing unit 2 performs a loudness correction in which the level increase amounts are increased as the sound volume set value of the master volume 6 decreases using, as a reference, 80 phons which corresponds to the sound volume set value 0 dB of the master volume 6 so that an auditory-sense-related frequency characteristic corresponding to this reference is maintained.

As shown in FIG. 3, when the sound volume set value of the master volume 6 is larger than or equal to 0 dB, the signal processing unit 2 sets the level increase amounts to 0, that is, performs no loudness correction.

On the other hand, signal processing unit 2 increases the level at 100 Hz by 0.25 dB every time the sound volume set value of the master volume 6 decreases by 1 dB starting from 0 dB. For example, when the sound volume set value of the master volume 6 is −1 dB, the signal processing unit 2 increases the level at 100 Hz by 0.25 dB.

When the sound volume set value of the master volume 6 is made −40 dB, the signal processing unit 2 increases the levels at 100 Hz and 10 kHz by 10 dB and 2 dB, respectively. When the sound volume set value of the master volume 6 is smaller than or equal to −40 dB, the signal processing unit 2 increases the levels at 100 Hz and 10 kHz by 0.5 dB and 0.15 dB, respectively, every time the sound volume set value of the master volume 6 decreases by 1 dB. For example, when the sound volume set value of the master volume 6 is −41 dB, the signal processing unit 2 increases the levels at 100 Hz and 10 kHz by 10.5 dB and 2.15 dB, respectively.

When the sound volume set value of the master volume 6 is smaller than or equal to −60 dB, the signal processing unit 2 fixes the level increase mounts (i.e., increases the levels at 100 Hz and 10 kHz by 20 dB and 5 dB, respectively).

As described above, the signal processing unit 2 performs a loudness correction that the levels of low-frequency components and high-frequency components are increased as the sound volume set value of the master volume 6 decreases so that the auditory-sense-related frequency characteristic corresponding to the sound volume set value 0 dB (80 phons) of the master volume 6 is maintained. As a result, frequency characteristics suitable for human auditory sense are realized and a phenomenon that low-frequency components and high-frequency components become less audible when the sound volume is small can be prevented.

The loudness correction shown in FIG. 3 assumes that in an ideal environment (reference environment), listening is done at the listening position at a proper sound amount for a sound volume set value of the master volume 6 (80 phons at 0 dB, 60 phons at −20 dB, 40 phons at −40 dB, etc.). However, an actual listening environment may be such that a sound volume set value of the master volume 6 is not reflected properly at a listening position. For example, even if the sound volume set value of the master volume 6 is −40 dB, (40 phons), the sound volume at the actual listening position does not necessarily becomes 40 phons and may become 50 phons or 30 phons, for example.

In view of the above, in the audio signal processing device 10 according to the embodiment, a loudness correction is performed by measuring sound volumes at the actual listening position using the microphone 101 that is installed at the listening position.

Figure 4:
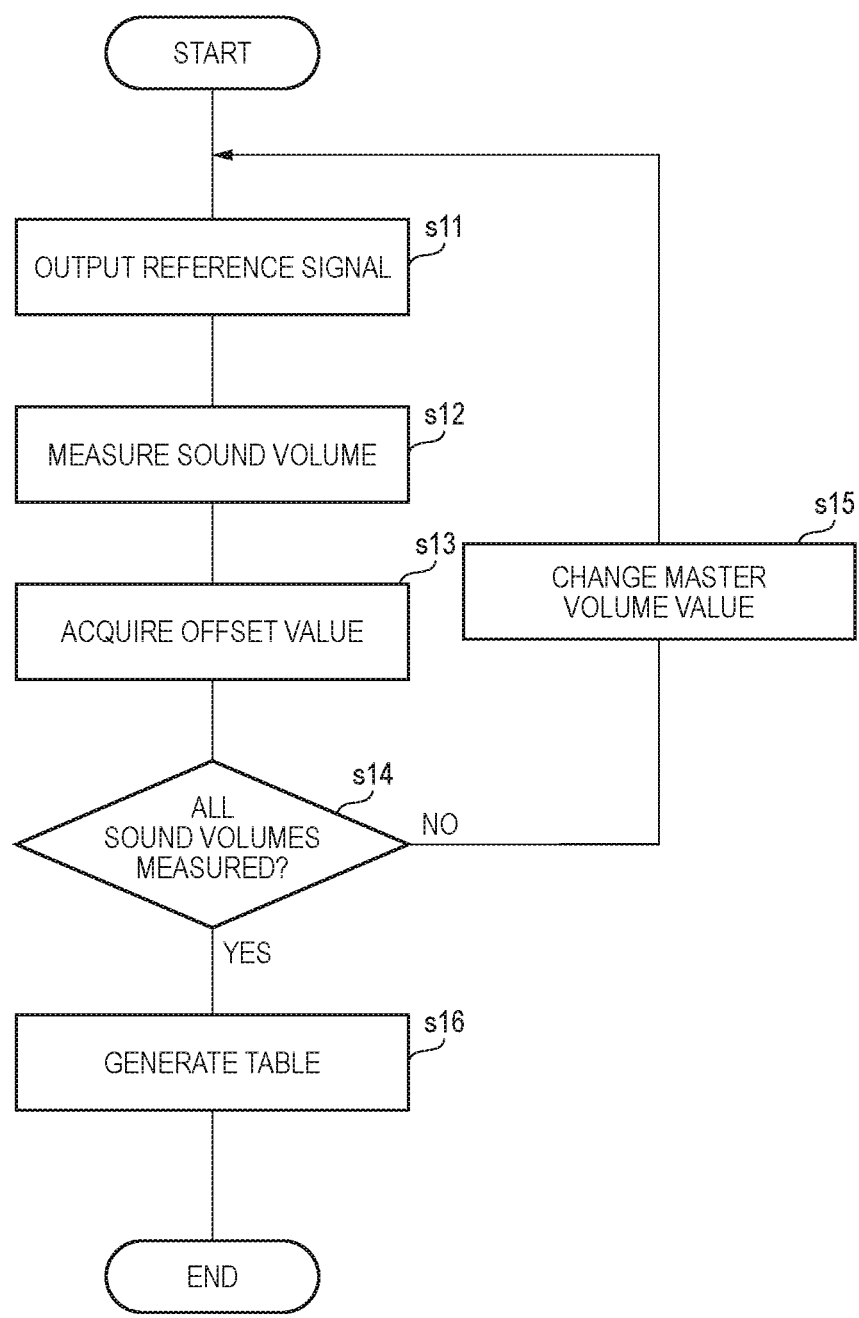
FIG. 4 is a flowchart illustrating how a control unit operates.

FIG. 4 is a flowchart illustrating how the control unit 7 operates. First, the control unit 7 performs a sound volume measurement in a listening environment concerned (at this time, the control unit 7 functions as a sound volume measuring unit of the invention). The control unit 7 performs the operation shown in FIG. 4 as soon as a user (listener) installs the microphone 101 at the listening position and commands a start of measurement using a user I/F (e.g., remote controller; not shown).

The control unit 7 generates a reference signal for measurement and causes, via the signal processing unit 2, the sound level adjusting unit 3, the amplification unit 4, and the output unit 5, a prescribed speaker (e.g., speaker 21C) to emit a sound corresponding to the reference signal (s11). The reference signal is a sinusoidal wave of 1 kHz, for example, and has a full-scale level (maximum amplitude), for example. However, the reference signal is not limited to a sinusoidal wave and may be white noise, pink noise, or the like.

Then the control unit 7 measures a sound volume at the listening position by measuring a signal level of a sound picked up by the microphone 101 (s12). The control unit 7 thereafter calculates an offset value by comparing the sound volume measured at the listening position with a sound volume set value of the master volume 6 at the time of the measurement (s13). The offset value is a difference of the sound volume measured using the microphone 101 from the sound volume set value of the master volume 6. For example, if a reference signal level is measured to be 75 phons when the sound volume set value of the master volume 6 is 0 dB (80 phons), an offset value −5 dB is obtained. The calculated offset value is stored in a memory (not shown). It is assumed that in the audio signal processing device 10 influence of the characteristics of the microphone 101 is canceled so that a measurement result of a reference signal level becomes equal to the sound volume set value of the master volume 6 (e.g., so that a sound volume 80 phons is measured as a reference signal level when the sound volume set value of the master volume 6 is 0 dB) in the reference environment.

Subsequently, the control unit 7 judges whether or not sound volumes have been measured at the listening position for all of the sound volume set values of the master volume 6 or not (s14). That is, the control unit 7 judges whether or not sound volumes have been measured for the respective sound volume set values of the master volume 6 from the maximum value (0 dB) to the minimum value (−60 dB) using the reference signal. If not all sound volumes have been measured yet, the control unit 7 changes the sound volume set value of the master volume 6 (s15) and performs step s11 and the following steps again. For example, the control unit 7 measures a sound volume using the reference signal after changing the sound volume set value of the master volume 6 from 0 dB to −1 dB.

If judging that all sound volumes have been measured, the control unit 7 generates a table using offset values stored in the memory (s16). FIG. 5 shows a table of offset values. As shown in FIG. 5, the control unit 7 determines offset values corresponding to the respective volume set values using the sound volume set values of the master volume 6 and the sound volumes measured using the microphone 101 in order of the sound volume set values of the master volume 6 (from the maximum value (0 dB) to the minimum value (−60 dB)).

For example, in the offset value table shown in FIG. 5, the offset value is equal to −5 dB for the sound volume set values 0 dB to −20 dB of the master volume 6. In contrast, for the sound volume set values −21 dB and smaller, the sound volume at the listening position decreases more than the sound volume set value of the master volume 6 does. For example, when the sound volume set value of the master volume 6 is −21 dB, −22 dB, and −40 dB, the offset value is equal to −5.1 dB, −5.2 dB, and −10 dB, respectively. For the sound volume set values −40 dB and smaller, the sound volume at the listening position decreases even more than the sound volume set value of the master volume 6 does. For example, whereas the offset value is equal to −10 dB when the sound volume set value of the master volume 6 is −40 dB, the offset value is equal to −10.2 dB when the sound volume set value of the master volume 6 is −41 dB.

It is not always necessary to calculate offset values by measuring a sound volume every 1 dB (see FIG. 5), a sound volume may be measured every 10 dB, for example. And an unmeasured sound volume may be interpolated from measurement results corresponding to other sound volume set values. For example, if sound volumes corresponding to sound volume set values −20 dB and −40 dB of the master volume 6 are measured to be 55 phons and 30 phons, respectively, a sound volume corresponding to −30 dB is interpolated to be 42.5 phons (offset value: −7.5 dB) by averaging them.

Figure 6:
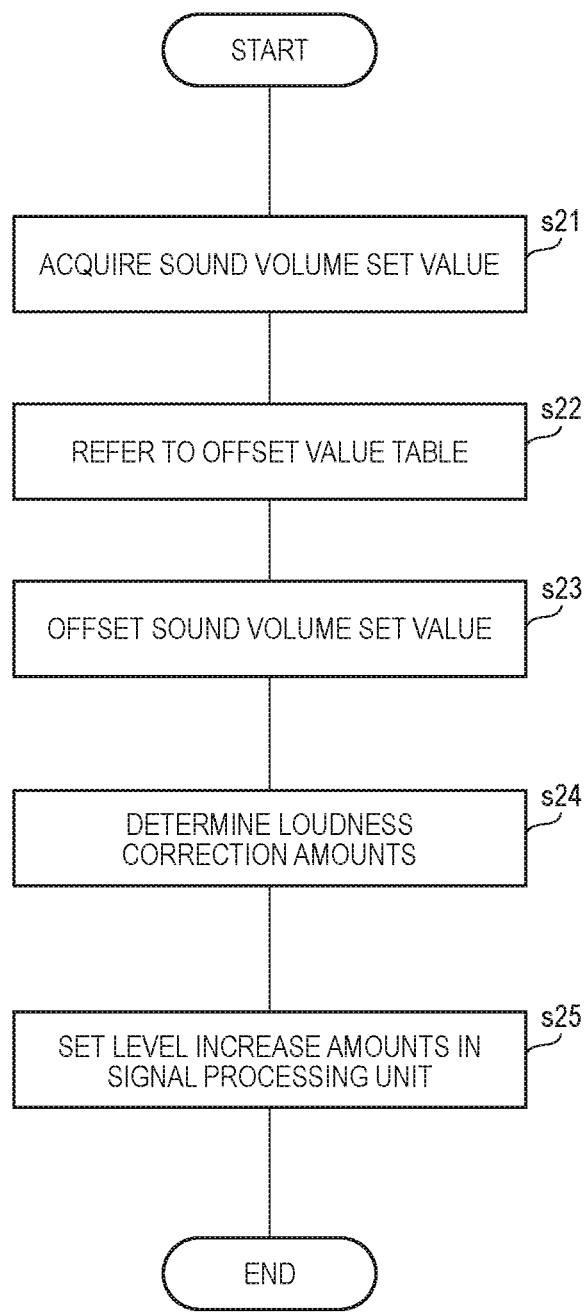
FIG. 6 is a flowchart illustrating how the control unit operates in performing a loudness correction.

The offset value table generated in the above manner is referred to in performing a loudness correction. FIG. 6 is a flowchart illustrating how the control unit 7 operates in performing a loudness correction. The control unit 7 performs the operation of FIG. 6 when receiving an audio signal from the input unit 1.

First, the control unit 7 acquires a sound volume set value of the master volume 6 (s21) and refers to the offset value table shown in FIG. 5 (s22). Then the control unit 7 adds the offset value acquired by referring to the table to the acquired sound volume set value of the master volume 6 (s23) and determines level adjustment amounts for a loudness correction using the sound volume set value thus offset (s24).

For example, as shown in FIG. 5, when the sound volume set value of the master volume 6 is −40 dB, the offset value is equal to −10 dB. Thus, when the sound volume set value of the master volume 6 is −40 dB, the control unit 7 performs a loudness correction of a case that the sound volume set value of the master volume 6 is −50 dB. More specifically, as shown in FIG. 3, the control unit 7 sets the level adjustment amounts at 100 Hz and 10 kHz to +15 dB and +3.5 dB, respectively.

For another example, as shown in FIG. 5, when the sound volume set value of the master volume 6 is −20 dB, the offset value is equal to −5 dB. Thus, when the sound volume set value of the master volume 6 is −20 dB, the control unit 7 performs a loudness correction of a case that the sound volume set value of the master volume 6 is −25 dB. More specifically, as shown in FIG. 3, the control unit 7 sets the level adjustment amounts at 100 Hz and 10 kHz to +625 dB and 0 dB, respectively.

If the table does not include the same value as a sound volume set value of the master volume 6, the control unit 7 may either read out an offset value corresponding to a closest sound volume set value or interpolate an offset value from plural offset values corresponding to nearby sound volume set values.

The control unit 7 sets the thus-determined level increase amount in the signal processing unit 2 (s25) and causes it to perform a loudness correction. As a result, the audio signal processing device 10 can perform a loudness correction in which a sound volume at the actual listening position is taken into consideration. Thus, the audio signal processing device 10 can perform a proper loudness correction irrespective of the distances between the listening position and the speaker. As in the case shown in FIG. 5, there are speakers in which the output level does not vary linearly with respect to the input level and the efficiency varies depending on the sound volume due to influence of physical characteristics, rigidity, or the like of the unit. However, the audio signal processing device 10 can perform a proper loudness correction because it performs offsetting by measuring sound volumes corresponding to the respective sound volume set values at the listening position.

Although the above description is directed to the signal processing for one channel, it is preferable that the control unit 7 perform sound volume measurements for all channels, that is, for all speakers, using a reference signal and determine level increase amounts of a loudness correction for each channel. However, a mode is possible in which the control unit 7 measures sound volumes only for a reference channel(s) (e.g., L channel and R channel) and perform loudness corrections for channels (e.g., C channel, SL channel, and SR channel) other than the reference channel on the basis of their differences in efficiency from the reference channel (e.g., L channel and R channel). For example, if the sound volumes of the L and R channels at the actual listening position are −40 dB when the sound volume set value of the master volume 6 is −20 dB and the efficiency differences between the L and R channels and the SL and SR channels are 20 dB when the sound volume is equal to −40 dB, for the SL and SR channels a loudness correction corresponding to −60 dB is performed which is even smaller by 20 dB.

The above description is directed to the case that the control unit 7 performs a volume measurement in advance and, during listening of a content (i.e., an audio signal is being input to the input unit 1), determines level increase amounts of a loudness correction by referring to the offset value table on the basis of a value of the master volume 6. An alternative configuration is possible in which a sound volume measurement using the microphone 101 is continued even during listening of a content and level increase amounts of a loudness correction are determined using current sound volume measurement results.

Although in the above example offset values are calculated by measuring sound volumes using a full-scale (maximum amplitude) reference signal, the amplitude of an actual input audio signal varies from 0 to a maximum value. Thus, the sound volume at the listening position also depends on the level of an input signal. For example, when the sound volume set value of the master volume 6 is −20 dB, the offset value is equal to −5 dB and hence a loudness correction corresponding to −25 dB is performed. If the sound volume measured currently using the microphone 101 is 40 phons (−40 dB), a loudness correction corresponding to −40 dB may be performed. However, it is desirable to prevent a rapid variation of the level increase amounts by performing lowpass filter processing on an audio signal detected by the microphone 101 and thereby absorbing a certain degree of temporal variation.

Figure 7:
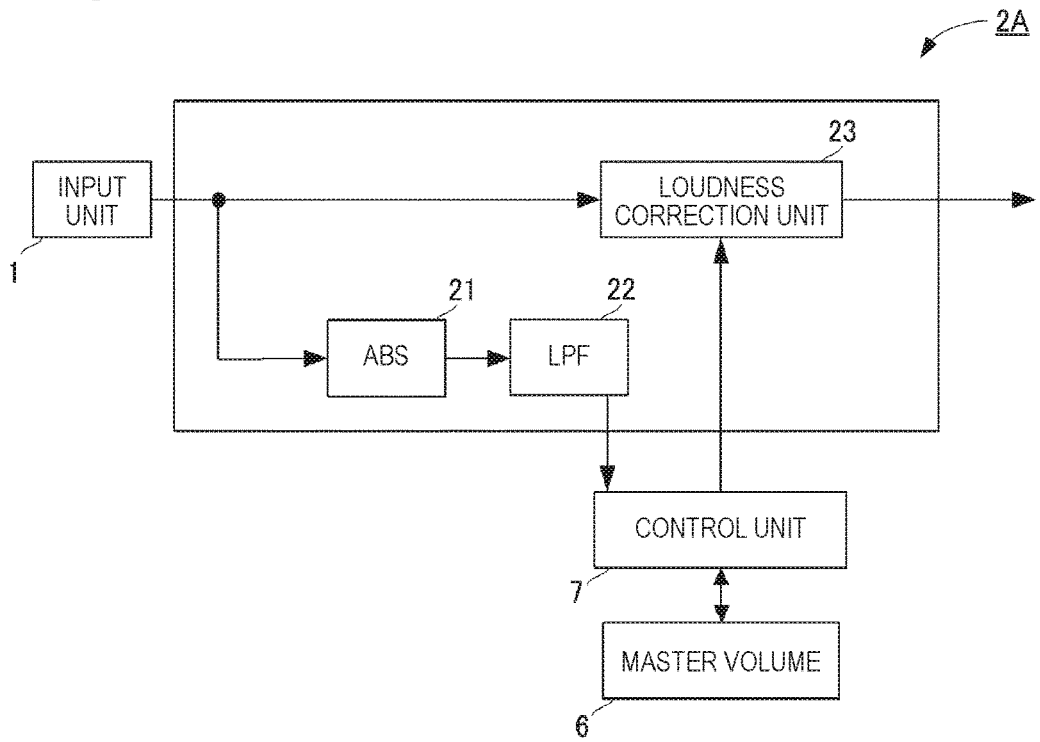
FIG. 7 is a block diagram showing the configuration of a signal processing unit used in Modification 1.

Next, FIG. 7 is a block diagram showing the configuration of a signal processing unit 2A used in Modification 1. The signal processing unit 2A used in Modification 1 is equipped with an ABS (absolute value conversion unit) 21, an LPF (lowpass filter) 22, and a loudness correction unit 23. The loudness correction unit 23 has the same functions as the signal processing unit 2 shown in FIG. 2 and performs a loudness correction according to settings made by the control unit 7.

The ABS 21, which corresponds to a level detection unit, detects a level (amplitude absolute value) of a digital audio signal received from the input unit 1. The detected amplitude absolute value is input to the control unit 7 via the LPF 22. Being a filter for attenuating high-frequency components of an input signal, the LPF 22 absorbs rapid value variations.

In this configuration, the control unit 7 offsets a sound volume set value of the master volume 6 according to the amplitude absolute value received from the LPF 22. As described above, although sound volumes at the listening position are measured using a full-scale reference signal, the absolute value of the amplitude of an actual input audio signal varies from moment to moment in a range of 0 to 1. In view of this, the control unit 7 determines level increase amounts of a loudness correction taking a level difference between the reference signal and an input signal into consideration. For example, when the sound volume set value of the master volume 6 is −20 dB in which case the offset value shown in FIG. 5 is −5 dB, if the amplitude value of an input signal is −15 dB with respect to the full-scale value (0 dB), a loudness correction corresponding to −40 dB is performed. More specifically, the level at 100 Hz is increased by 10 dB. With this measure, for example, even in the case of a musical piece such as a classical one in which the signal level varies to a large extent in a single piece, a phenomenon can be prevented that high-frequency components and low-frequency components are less audible when the sound volume is small.

Figure 8:
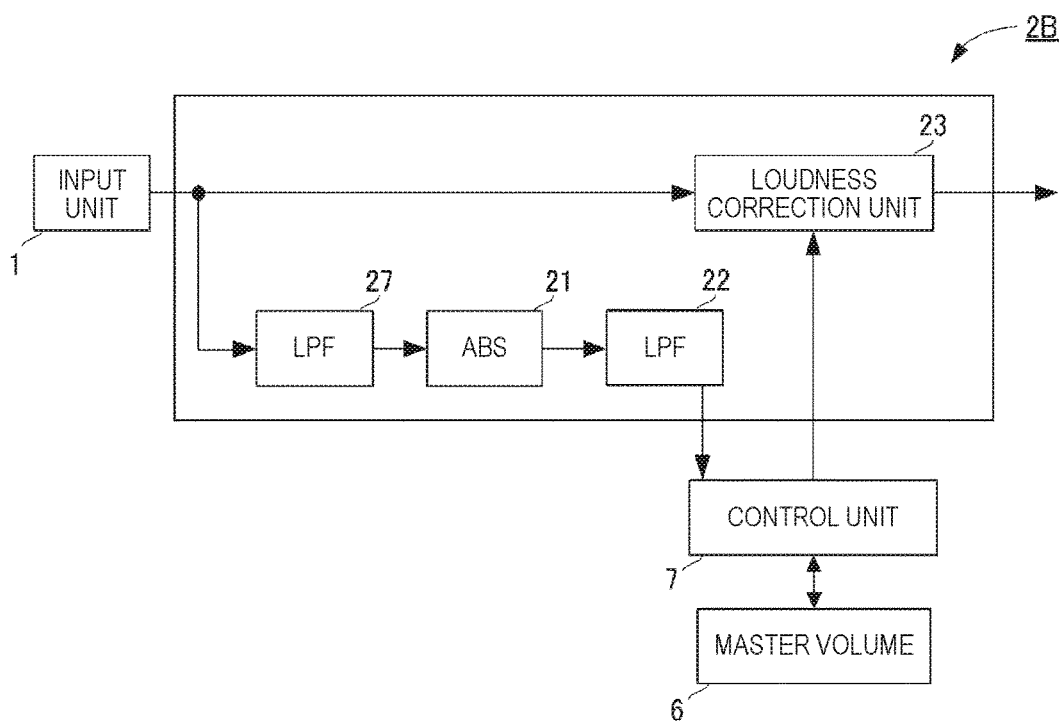
FIG. 8 is a block diagram showing the configuration of a signal processing unit used in Modification 2.

Next, FIG. 8 is a block diagram showing the configuration of a signal processing unit 2B used in Modification 2. Components having the same ones as in FIG. 7 are given the same symbols as the latter and descriptions therefor will be omitted.

The signal processing unit 2B used in Modification 2 is equipped with an LPF 27 upstream of the ABS 21. The LPF 27 attenuates high-frequency components of an input signal. The ABS 21 detects an amplitude value of the input signal whose high-frequency components have been attenuated.

In the signal processing unit 2A shown in FIG. 7, for example, in the case of an input signal having a frequency profile in which the levels of high-frequency components are high and those of low-frequency components are low, there may occur a phenomenon that because of high-level high-frequency components a large amplitude absolute value is detected by the ABS 21 to make the level increase amounts of a loudness correction small. However, human auditory sense is such that low-frequency components are less audible particularly when the sound volume is small but high-frequency components are less sensitive to the sound volume than low-frequency components. Thus, in the case of an input signal having a frequency profile in which the levels of high-frequency components are high and those of low-frequency components are low, the level increase amounts of a loudness correction may become insufficient. In view of this, in the signal processing unit 2B used in Modification 2 in which the LPF 27 performs lowpass filtering and the ABS 21 detects a level of an input signal that has been subjected to the lowpass filtering, a loudness correction is performed taking the levels of low-frequency components into consideration.

Figure 9:
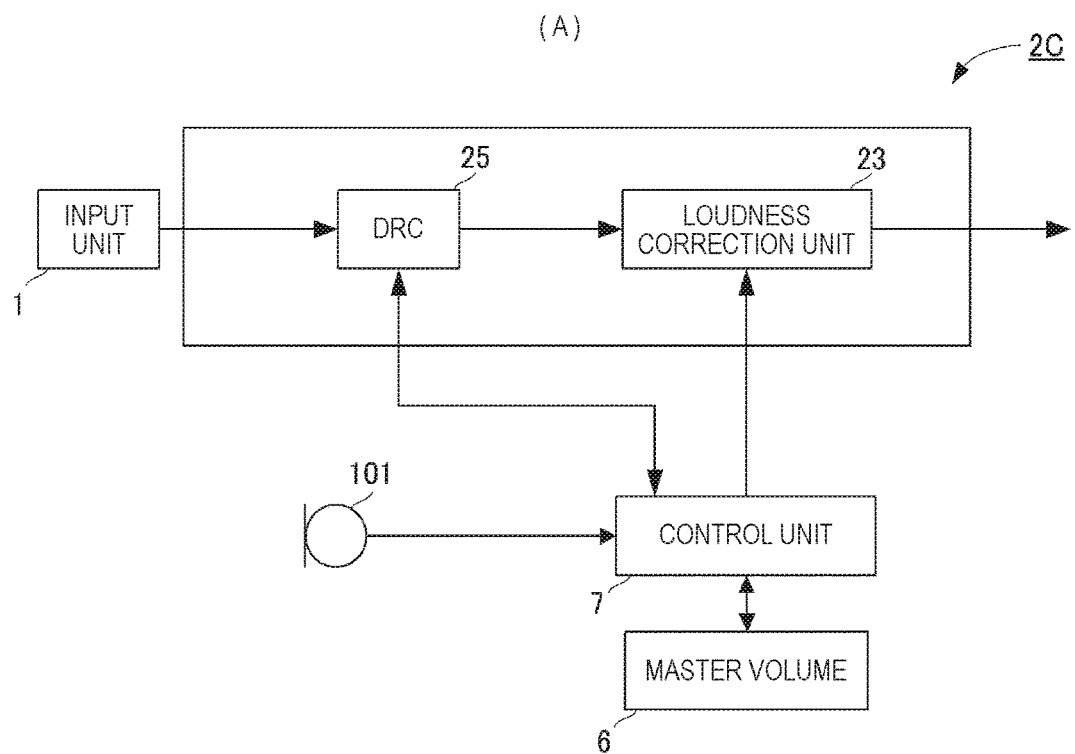
FIG. 9(A) is a block diagram showing the configuration of a signal processing unit used in Modification 3.
FIG. 9(B) is a graph showing an example of dynamic range compression.
Figure 9:
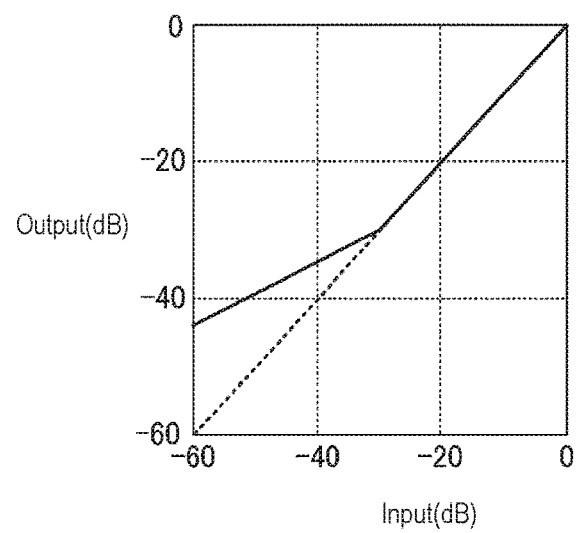

Next, FIG. 9(A) is a block diagram showing the configuration of a signal processing unit 2C used in Modification 3. Components having the same ones as in FIG. 7 are given the same symbols as the latter and descriptions therefor will be omitted, The signal processing unit 2C used in Modification 3 is equipped with the loudness correction unit 23 and a DRC (dynamic range compression) 25.

The DRC 25 performs dynamic range compression on an input signal. FIG. 9(B) is a graph showing an example of dynamic range compression. In the graph of FIG. 9(B), the horizontal axis represents the level of an input signal and the vertical axis represents the level of an output signal. The broken line indicates an input-output relationship of a case without dynamic range compression (the relationship is linear). The solid-line curve indicates an input-output relationship of a case with dynamic range compression.

As shown in FIG. 9(B), in a range that the level of an input signal is lower than or equal to −30 dB, the DRC 25 decreases (halves) the ratio of a level variation of an output signal to a level variation of the input signal and thereby increases the level of the output signal. For example, when the level of an input signal is −50 dB, the DRC 25 increases the level of an output signal to −40 dB.

The DRC 25 turns on or off the dynamic range compression according to an instruction from the control unit 7. The control unit 7 turns off the dynamic range compression of the DRC 25 when a sound volume measured using the microphone 101 is large (e.g., larger than −30 dB). That is, when a sound volume measured using the microphone 101 is large, the DRC 25 does not perform dynamic range compression and produces an output signal according to the linear relationship indicated by the broken line in FIG. 9(B).

In contrast, when a sound volume measured using the microphone 101 is small (e.g., smaller than or equal to −30 dB), the dynamic range compression of the DRC 25 is turned on. That is, when a sound volume measured using the microphone 101 is small, the DRC 25 performs dynamic range compression on the input signal of −30 dB or smaller according to the relationship indicated by the solid-line curve in FIG. 9(B).

With this measure, when the sound volume is small, the level is increased by the dynamic range compression over the entire frequency range, whereby the input signal is made more audible to a listener. Furthermore, a loudness correction suitable for the level of an input signal is enabled.

Although the invention has been described in detail by referring to the particular embodiments, it is apparent to those skilled in the art that various changes and modifications are possible without departing from the spirit and scope of the invention.

The present application is based on Japanese Patent Application No. 2014-056941 filed on Mar. 19, 2014, the disclosure of which is incorporated herein by reference.

INDUSTRIAL APPLICABILITY

The audio signal processing device and the audio signal processing method according to the invention make it possible to perform a proper loudness correction irrespective of the distances between a listening position and speakers and a listening environment.

DESCRIPTION OF SYMBOLS

1 . . . Input unit
2 . . . Signal processing unit
3 . . . Level adjusting unit
4 . . . Amplification unit
5 . . . Output unit
6 . . . Master volume
7 . . . Control unit
10 . . . Audio signal processing device
21C, 21L, 21R, 21SL, 21SR . . . Speakers
101 . . . Microphone

The invention claimed is:

1. An audio signal processing device comprising:
an audio signal processing unit configured to perform signal processing on an audio signal;
a sound volume setting receiving unit configured to receive a sound volume set value;
a sound volume measuring unit configured to measure a sound volume at a listening position; and
a level detection unit configured to detect a level of the audio signal prior to volume control,
wherein the audio signal processing unit performs a loudness correction which increases a level of the audio signal in a prescribed frequency range as the sound volume set value decreases;
wherein the sound volume measuring unit measures sound volumes corresponding to plural respective sound volume set values at the listening position;
wherein the audio signal processing unit sets a level adjustment amount to be used in performing the loudness correction on the basis of the sound volume set value received by the sound volume setting receiving unit and the measurement sound volumes measured by the sound volume measuring unit; and
wherein the audio signal processing unit sets a level adjustment amount to be used in performing the loudness correction on the basis of the level of the audio signal detected by the level detection unit, the sound volume set value received by the sound volume setting receiving unit, and the measurement sound volumes measured by the sound volume measuring unit.

2. The audio signal processing device according to claim 1, wherein the audio signal processing unit performs the loudness control on each of audio signal of plural channels;
wherein the sound volume measuring unit measures sound volumes of an audio signal of a reference channel at the listening position; and
wherein for the audio signal of the reference channel, the audio signal processing unit sets a level adjustment amount to be used in performing the loudness correction on the basis of the sound volume set value received by the sound volume setting receiving unit and the measurement sound volumes measured by the sound volume measuring unit, and for audio signals of channels other than the reference channel, the audio signal processing unit sets level adjustment amounts to be used in performing the loudness correction on the basis of the sound volume set value received by the sound volume setting receiving unit and efficiency differences between respective speakers for output of the audio signals of the channels other than the reference channel and a speaker for output of the audio signal of the reference channel.

3. The audio signal processing device according to claim 1, wherein the audio signal processing unit performs the loudness control on each of audio signals of plural channels;
wherein the sound volume measuring unit measures sound volumes of the audio signals of the plural channels at the listening position, respectively; and
wherein the audio signal processing unit sets level adjustment amounts to be used in performing the loudness correction on the basis of the sound volume set value received by the sound volume setting receiving unit and the measurement sound volumes of the audio signals of the plural channels measured by the sound volume measuring unit.

4. The audio signal processing device according to claim 1, further comprising:
a lowpass filter configured to attenuate a high-frequency component of the input signal, wherein the level detection unit detects a level of the input signal whose high-frequency component has been attenuated by the lowpass filter.

5. The audio signal processing device according to claim 1, wherein the sound volume measuring unit continues to measure sound volumes; and
wherein the audio signal processing unit sets a level adjustment amount to be used in performing the loudness correction using a current measurement sound volume.

6. The audio signal processing device according to claim 5, further comprising:
a dynamic range compression processing unit configured to perform dynamic range compression on the input signal;
wherein the dynamic range compression processing unit performs the dynamic range compression using the current measurement sound volume measured by the sound volume measuring unit; and
wherein the audio signal processing unit performs the loudness correction on the input signal that has been subjected to the dynamic range compression.

7. An audio signal processing method comprising:
an audio signal processing step of performing signal processing on an audio signal;
a sound volume setting receiving step of receiving a sound volume set value;
a sound volume measuring step of measuring a sound volume at a listening position; and
a level detection step of detecting a level of the audio signal prior to volume control,
wherein in the audio signal processing step, a loudness correction which increases a level of the audio signal in a prescribed frequency range as the sound volume set value decreases is performed;
wherein in the sound volume measuring step, sound volumes corresponding to plural respective sound volume set values at the listening position are measured; and
wherein in the audio signal processing step, a level adjustment amount to be used in performing the loudness correction is set on the basis of the sound volume set value received in the sound volume setting receiving step and the measurement sound volumes measured in the sound volume measuring step; and
wherein in the audio signal processing step, a level adjustment amount to be used in performing the loudness correction is set on the basis of the level of the audio signal detected in the level detection step, the sound volume set value received in the sound volume setting receiving step, and the measurement sound volumes measured in the sound volume measuring step.

8. The audio signal processing method according to claim 7, wherein in the audio signal processing step, the loudness control on each of audio signals of plural channels is performed;
wherein in the sound volume measuring step, sound volumes of an audio signal of a reference channel at the listening position is measured; and wherein for the audio signal of the reference channel, in the audio signal processing step, a level adjustment amount to be used in performing the loudness correction is set on the basis of the sound volume set value received in the sound volume setting receiving step and the measurement sound volumes measured in the sound volume measuring step, and for audio signals of channels other than the reference channel, in the audio signal processing step, level adjustment amounts to be used in performing the loudness correction are set on the basis of the sound volume set value received in the sound volume setting receiving step and efficiency differences between respective speakers for output of the audio signals of the channels other than the reference channel and a speaker for output of the audio signal of the reference channel.

9. The audio signal processing method according to claim 7, wherein in the audio signal processing step, the loudness control on each of audio signals of plural channels is performed;
wherein in the sound volume measuring step, sound volumes of the audio signals of the plural channels at the listening position are measured, respectively; and
wherein in the audio signal processing step, level adjustment amounts to be used in performing the loudness correction are set on the basis of the sound volume set value received in the sound volume setting receiving step and the measurement sound volumes of the audio signals of the plural channels measured in the sound volume measuring step.

10. The audio signal processing method according to claim 7, further comprising:
a high-frequency component attenuating step of attenuating a high-frequency component of the input signal,
wherein in the level detection step, a level of the input signal whose high-frequency component has been attenuated in the high-frequency component attenuating step is detected.

11. The audio signal processing method according to claim 7, wherein in the sound volume measuring step, sound volumes are continuously measured; and
wherein in the audio signal processing step, a level adjustment amount to be used in performing the loudness correction is set using a current measurement sound volume.

12. The audio signal processing method according to claim 11, further comprising:
a dynamic range compression processing step of performing dynamic range compression on the input signal,
wherein in the dynamic range compression processing step, the dynamic range compression is performed using the current measurement sound volume measured in the sound volume measuring step; and
wherein in the audio signal processing step, the loudness correction on the input signal that has been subjected to the dynamic range compression is performed.

* * * * *